(12) United States Patent
Shim et al.

(10) Patent No.: US 11,643,753 B2
(45) Date of Patent: *May 9, 2023

(54) LAYERED GROUP III-V COMPOUND AND NANOSHEET CONTAINING ANTIMONY, AND ELECTRICAL DEVICE USING THE SAME

(71) Applicant: Industry-Academic Cooperation Foundation, Yonsei University, Seoul (KR)

(72) Inventors: Woo-young Shim, Seoul (KR); Ji-hong Bae, Uiwang-si (KR)

(73) Assignee: Industry-Academic Cooperation Foundation, Yonsei University, Seoul (KR)

(*) Notice: Subject to any disclaimer, the term of this patent is extended or adjusted under 35 U.S.C. 154(b) by 225 days.

This patent is subject to a terminal disclaimer.

(21) Appl. No.: 17/111,190

(22) Filed: Dec. 3, 2020

(65) Prior Publication Data

US 2022/0081802 A1 Mar. 17, 2022

(30) Foreign Application Priority Data

Sep. 14, 2020 (KR) .......... 10-2020-0117534
Sep. 14, 2020 (KR) .......... 10-2020-0117535
Sep. 14, 2020 (KR) .......... 10-2020-0117537

(51) Int. Cl.
| | |
|---|---|
| C30B 29/40 | (2006.01) |
| C30B 29/68 | (2006.01) |
| C01G 30/00 | (2006.01) |
| B82Y 30/00 | (2011.01) |
| B82Y 40/00 | (2011.01) |

(52) U.S. Cl.
CPC .......... *C30B 29/40* (2013.01); *C01G 30/002* (2013.01); *C30B 29/68* (2013.01); *B82Y 30/00* (2013.01); *B82Y 40/00* (2013.01); *C01P 2002/02* (2013.01); *C01P 2002/20* (2013.01); *C01P 2002/90* (2013.01); *C01P 2006/40* (2013.01)

(58) Field of Classification Search
CPC .......... C30B 29/40; C30B 29/68; C30B 1/04; C01G 30/002; B82Y 30/00; B82Y 40/00; C01P 2002/02; C01P 2002/20; C01P 2002/90; C01P 2006/40
USPC .......................................... 428/332; 423/299
See application file for complete search history.

(56) References Cited

U.S. PATENT DOCUMENTS

| | | | | |
|---|---|---|---|---|
| 2018/0174766 | A1* | 6/2018 | Zhamu | H01G 11/50 |
| 2018/0351200 | A1* | 12/2018 | Zhamu | H01M 10/0565 |
| 2019/0207200 | A1* | 7/2019 | Zhamu | H01M 10/054 |
| 2020/0028179 | A1* | 1/2020 | He | H01M 4/587 |
| 2020/0147693 | A1* | 5/2020 | Lu | H01G 11/70 |
| 2022/0144661 | A1* | 5/2022 | Shim | H01L 21/02175 |

FOREIGN PATENT DOCUMENTS

| | | | | |
|---|---|---|---|---|
| CN | 112792350 A | * | 5/2021 | .......... B22F 1/0018 |
| KR | 20190132152 A | | 11/2019 | |
| KR | 20190132294 A | | 11/2019 | |
| KR | 10-2057700 B1 | | 12/2019 | |

OTHER PUBLICATIONS

CAS reg. no. 138701-26-5, Jan. 31, 1992. (Year: 1992).*
Teresa L.T. Birdwhistell et al., "Synthesis and Crystal Structures of the Layered I-III-V Zintl Phases, K4In4 X6, where X=As, Sb", J. Mater. Chem., 1991, 1(4), 555-558. (Year: 1991).*
Valentin Panayotov et al., "Controlling Neutral Mixtures: Thin Film Deposition via Laser Ablation and Selective Ioniation of K4In4Sb6", Chem. Mater., 1998, 10, 1091-1095. (Year: 1998).*
Valentin Panayotov et al., "III-V Semiconductor thin films via laser ablation/ionization of I-III-V Zintl-phase materials", SPIE 1995, 2547, 328-341. (Year: 1995).*
Ofogh Tizno et al., "Room-temperature Operation of Low-voltage, Non-volatile, Compound-semiconductor Memory Cells", Scientific Reports, Jun. 20, 2019.
G. Cordier et al., "Crystal structure of potassium phyllodiantimonidogallate, KGaSb2", Zeitschrift fur Kristallographie, vol. 197, pp. 297-298, Jul. 1, 1991.
D D Firsov et al., "Temperature-dependent photoluminescence of InSb/InAs nanostructures with InSb thickness in the above-monolayer range", Journal of Physics D: Appl. Physis, vol. 49, 285108, Jun. 21, 2016.

* cited by examiner

*Primary Examiner* — Douglas J McGinty
(74) *Attorney, Agent, or Firm* — Bridgeway IP Law Group, PLLC; Jihun Kim

(57) ABSTRACT

Proposed are a layered Group III-V antimony compound, a Group III-V nanosheet that may be prepared using the same, and an electrical device including the materials. There is proposed a layered compound having a composition represented by [Formula 1] $M_{x-m}A_ySb_z$ (Where M is at least one of Group I elements, A is at least one of Group III elements, x, y, and z are positive numbers which are determined according to stoichiometric ratios to ensure charge balance when m is 0, and 0<m<x).

13 Claims, 10 Drawing Sheets

Sample A

Sample C

LAYERED GROUP III-V COMPOUND AND NANOSHEET CONTAINING ANTIMONY, AND ELECTRICAL DEVICE USING THE SAME

BACKGROUND OF THE INVENTION

1. Field of the Invention

The present invention relates to a Group III-V layered compound and a nanosheet containing antimony, and an electrical device using the same, and more particularly, to a layered compound and a nanosheet containing an alkali metal and containing antimony having various electrical properties, and an electrical device using the same.

2. Description of the Related Art

Layered compounds connected to interlayers through van der Waals bonds may show various properties, and the layered compounds may be delaminated through physical or chemical methods to prepare two-dimensional (2D) nanosheets having a thickness of several to hundreds of nanometers, and thus, active research into the layered compounds is underway.

In particular, low-dimensional materials such as nanosheets are expected to have innovative new functions that existing bulk materials fail to provide, and are highly likely to serve as next-generation future materials instead of the existing materials.

However, up until now, the layered compounds having a two-dimensional crystal structure are limited to materials such as graphite, transition metals, and chalcogen compounds to hardly develop into materials of various compositions.

Meanwhile, Group III-V compounds including antimony containing gallium antimonide or aluminum antimonide may be widely used in various electrical devices as a compound semiconductor material but Group III-V antimony compounds having a layered structure are not specifically known till now.

The Group III-V antimony compounds having a layered structure, unlike existing Group III-V antimony compounds having a different crystal structure, are expected to allow diversified application, and to be applicable to new areas that have not been reached before.

RELATED ART DOCUMENT

[Patent Document]
Korean Registered Patent Publication No. 10-2057700
Korean Patent Laid-open Publication No. 2019-0132294
Korean Patent Laid-open Publication No. 2019-0132152

SUMMARY OF THE INVENTION

According to an embodiment of the invention, there are provided a layered Group III-V antimony compound, a Group III-V nanosheet that may be prepared using the same, and an electrical device including the materials.

According to a first aspect of the invention, there is provided a layered compound having a composition represented by Formula 1 below.

  [Formula 1]

$$M_{x-m}A_ySb_z$$

(Where M is at least one of Group I elements, A is at least one of Group III elements, x, y, and z are positive numbers which are determined according to stoichiometric ratios to ensure charge balance when m is 0, and $0<m<x$).

According to a second aspect of the invention, there is provided a nanosheet including a composition represented by Formula 1 below and prepared through a physical or chemical peeling method.

According to a third aspect of the invention, there is provided an electrical device including the layered compound of the first aspect or the nanosheet of the second aspect.

Embodiments of the invention provide a layered Group III-V antimony compound having various compositions or a nanosheet, and the compound and the nanosheet may have various electrical properties to enable application to various electrical devices.

DETAILED DESCRIPTION OF THE EXEMPLARY EMBODIMENTS

Figure 1:
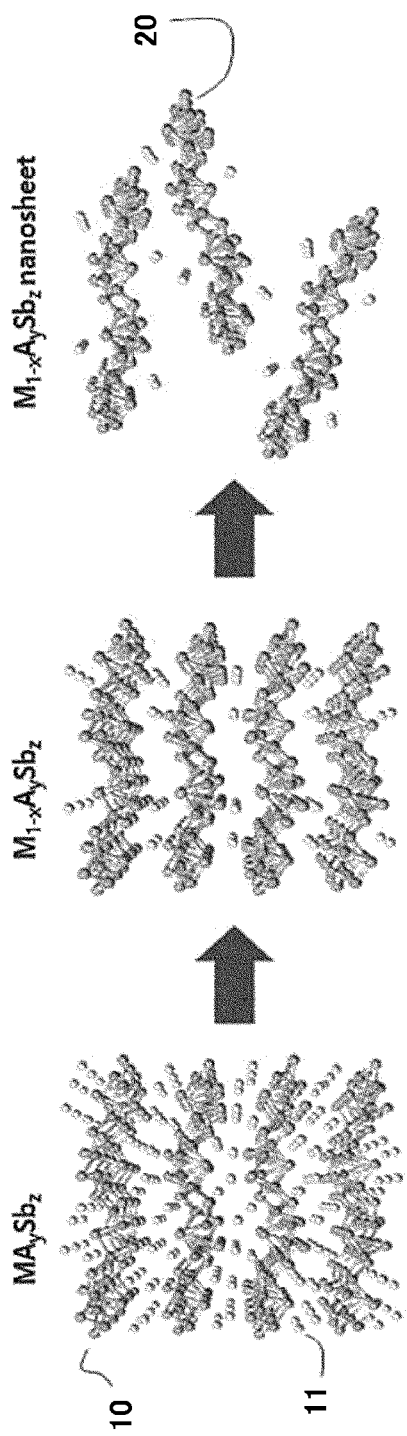
FIG. 1 is a conceptual view illustrating a layered Group III-V antimony compound according to an embodiment of the invention and a nanosheet prepared using the same.

Hereinafter, configuration and operation of embodiments of the invention will be described with reference to the accompanying drawings. In the following description, when it is determined that the specific description of the known related art unnecessarily obscures the gist of the invention, the detailed description thereof will be omitted. In addition, when an element "includes" a component, it may indicate that the element does not exclude another component unless explicitly described to the contrary, but can further include another component.

A compound according to an embodiment of the invention is represented by Formula 1 and has a layered structure.

[Formula 1]

$M_{x-m}A_ySb_z$ (Where M is at least one of Group I elements, A is at least one of Group III elements, x, y, and z are positive numbers which are determined according to stoichiometric ratios to ensure charge balance when m is 0, and $0<m<x$).

The compound of an embodiment of the invention has a layered structure, and in general, Group III-V antimony compounds such as a GaSb compound or an InSb compound have a three-dimensional structure, having difficulty in exhibiting a layered structure. In order to overcome the limitation, inventors of the invention added Group I elements (hereinafter referred to as an "additive element") to a Group III-V antimony compound to place the additive elements between Group III-V antimony compound layers to prepare a layered compound in which the Group III-V antimony compound layers are connected. The additive elements positioned between the Group III-V antimony compound layers provide a weak bond between the Group III-V antimony compound layers through van der Waals force, and thus a plane on which the additive elements are positioned forms a cleavage plane that is easily cleaved along the plane.

Accordingly, the layered compound according to an embodiment of the invention may be easily peeled off into the Group III-V antimony compound layers along the cleavage plane through either or both physical or chemical methods, and the peeling is more easily achieved with an increasing amount of the additive elements removed. Therefore, a Group III-V compound nanosheet may be easily prepared from the layered compound, and in this case, the additive elements partially remain in the Group III-V compound nanosheet.

With the continuous removal of the additive elements, the interlayer distance between the Group III-V compound layers gradually becomes greater, and eventually the interlayer bond breaks down, which may cause cracks between the layers. Therefore, the layered structure of the layered compound described in an embodiment of the invention includes a case where repeating two-dimensional Group III-V antimony compound layers are interlayer-bonded through van der Waals bonds by additive elements as well as a case where the interlayer bonding force of the Group III-V antimony compound is completely or partially removed to increase the interlayer distance, thereby forming cracks.

In addition, the two-dimensional Group III-V antimony compound layers may exhibit a two-dimensional bonding structure before the removal of additive elements, but when the additive elements are removed greater than a certain level, the bonding structure may change in the Group III-V antimony compound layers, and the structure change may include a change from a two-dimensional bonding structure before the removal to a three-dimensional bonding structure or an amorphous structure. However, even in this case, since the antimony compound layers keep the two-dimensional shape, except the change in the crystal structure in the layers, the compound layers still exhibit the layered structure due to the structure that the interlayer bonding keeps the van der Waals bonds by additive elements.

Therefore, in an embodiment of the invention, the layered structure includes a case where the Group III-V compound layers form two-dimensional bonds in respective layers and form interlayer-bonds through van der Waals bond by additive elements as well as a case where cracks are formed between the layers with the removal of additive elements, and further includes a case where the Group III-V antimony compound layers are three-dimensionally bonded, but these layers keep a two-dimensional shape, and the bond between these layers is a van der Waals bond by additive elements rather than a bond between Group III-V antimony compounds or the bonding force is completely or partially removed, thereby forming cracks.

A conceptual view for examples of the layered compound and a nanosheet prepared therefrom is shown in FIG. 1. First, a layered Group III-V antimony compound is synthesized using additive elements. In this case, the layered Group III-V antimony compound keeps a layered structure through additive elements 11, the additive elements 11 which are Group I elements are positioned between $A_ySb_z$ layers 10 which are Group III-V antimony compounds, to keep the bonding between the layers 10 through the van der Waals bonds, and when the additive elements 11 are removed, the bonding force between the antimony layers 10 in $M_{x-m}A_ySb_z$ decreases or the interlayer distance increases, thereby forming cracks, and accordingly, in the end, a $M_{x-m}A_ySb_z$ nanosheet 20 is prepared by being peeled off from the layered compound.

The nanosheet 20 prepared when peeled off from the layered compound is formed of a plurality of $A_ySb_z$ layers of two or more overlapping each other, and may thus be several hundreds of nm thick. In general, nanosheets may exhibit anisotropy according to a two-dimensional shape only when a thickness to a lateral width is less than a certain level. To this end, the ratio of a thickness (d) to a width (L) of a nanosheet (d/L) is preferably 0.1 or less. A width of the nanosheet prepared through an embodiment of the invention may be 5 μm or more, and thus, a thickness of the nanosheet is preferably 500 nm or less.

As described above, the nanosheet according to an embodiment of the invention is a sheet peeled off from the layered compound, which includes two or more two-dimensional Group III-V antimony compound layers, and includes a case where the Group III-V antimony compound layers, when provided in plurality, are bonded through van der Waals bonds by additive elements. In this case, the two-dimensional Group III-V compound layers may have a two-dimensional bonding structure or a three-dimensional bonding structure.

The peeling method may be physical or chemical peeling, and a generally known peeling method using a tape may be used. In addition, to enable easier peeling, the peeling may be performed through irradiation with ultrasonic waves in a liquid state or using a tape after chemical treatment in an acid or base solution.

Additive elements may be Group I elements such as Li, Na, K, Rb, Cs, Fr, etc. In particular, Na and K, which are Group I elements, may be advantageous as additive elements to synthesize layered compounds.

Group III-V antimony compounds forming $A_ySb_Z$ layers include, for example, GaSb, InSb, AlSb, etc. that may be used in various electrical devices, and an embodiment of the invention is not necessarily limited to the exemplified compounds.

Residual additive elements may satisfy 0<m<x, preferably 0.1x≤m≤0.9x, and more preferably 0.25x≤m≤0.75x, according to Formula 1 described above. In preparing a Group III-V antimony compound having a layered structure, it is preferable that additive elements to prepare a layered structure are completely removed. However, in the compound according to an embodiment of the invention, the additive elements to form a layered structure are not completely removed as the composition range described above and controlled such that a certain amount of the additive elements remains, so that new electrical properties such as ferroelectric-like properties are implemented in the Group III-V compound having a layered structure.

In $M_{x-m}A_ySb_z$ of Formula 1 above, x, y, and z refer to positive numbers at which M, A, and Sb elements have a charge balance according to stoichiometric ratios. In this case, as m is greater than 0 and smaller than x, vacancy is created in the place of additive elements M.

When the vacancy is created, the additive elements M positioned between the $A_ySb_z$ layers may move between the layers by an external magnetic field or electric field, and accordingly, the layered compound may exhibit ferroelectric-like properties.

In general, ferroelectric-like properties are found in oxides of an asymmetric structure such as $BaTiO_3$ having a perovskite structure. In the oxides of an asymmetric structure such as $BaTiO_3$, ferroelectric-like properties are shown according to changes in the position of Ba located in the center.

In contrast, the layered compound and the nanosheet according to an embodiment of the invention exhibit ferroelectric-like properties due to the movement of additive elements between the layers, despite having a polar-symmetry structure instead of the asymmetric structure.

In this stable $M_xA_ySb_z$, as the partial removal of the additive elements M comes with ferroelectric-like properties, m has to be greater than 0, and smaller than x to make sure that at least some of the additive elements remain.

Meanwhile, when m is removed in a too small amount, the movement between the layers may not be easy, and thus, m is 0.1x or greater, and when m is removed in an excessive amount, the layered structure may break down or there may be no additive elements required for the movement, thereby failing to obtain ferroelectric properties, and thus, m is preferably 0.9x or less, and more preferably 0.25x to 0.75x. In this case, the layered compound exhibits a two-dimensional bond structure to have a space group of $P2_1/c$ or Cmca.

In addition, when m is greater than 0.9x, the crystal structure of the antimony compound layers may change, and in particular, change to an amorphous structure. Despite the change to an amorphous structure, the layered structure is kept because the bonding between the antimony compound layers is still formed by the residual additive elements, and the residual additive elements may allow the antimony compound layers to exhibit electrical properties such as ferroelectric properties.

In addition, the layered compound and the nanosheet according to an embodiment of the invention may exhibit resistance switching properties.

When a material has resistance switching properties, current does not increase linearly according to voltages applied to the material, but when an initial voltage is applied, the material keeps a high resistance state to have an insignificant increase in the current and then when the material reaches a certain critical point, the material switches to a low resistance state to have a sharp increase in the current.

These resistance switching properties are generally found in oxides, and recently, using these properties, memory devices such as a memristor capable of storing information like a flash memory have been actively developed.

When preparing a Group III-V antimony compound according to an embodiment of the invention or a nanosheet formed of the compound, M as an additive element is added to synthesize a layered compound having a composition of $M_XA_ySb_Z$, and then the additive element, M is partially removed using an acid, and a layered compound having a composition of $M_{x-m}A_ySb_z$ may thus be prepared.

As such, when the additive element is removed through the strong acid, the place where the additive element is partially removed is replaced with hydrogen ions included in the strong acid, and as shown in Formula 2 below, a hydrogen-containing layered compound and nanosheet may be prepared.

[Formula 2]

$M_{x-m}H_nA_ySb_z$ (Where M is at least one of Group I elements, A is at least one of Group III elements, x, y, and z are positive numbers which are determined according to stoichiometric ratios to ensure charge balance when m is 0, and 0<m<x, and 0<n≤m).

As described above, the range of m may be preferably equal to or more than 0.1x and equal to or less than 0.9x, and more preferably equal to or more than 0.25x and equal to or less than 0.75x.

As such, the hydrogen-containing layered compound and nanosheet may have ferroelectric-like properties despite having a polar-symmetry structure as described above, and have resistance switching properties as well to be applied to various electrical devices, and in particular, to become applicable to memory devices such as memristors.

Example 1

1) Synthesis of $Na_2Al_2Sb_3$ having a layered structure

Metal pieces of Na, Al, and Sb were weighed according to the molar ratio, mixed, and then put into an alumina crucible, placed in a quartz tube, and double-sealed to block external air. The process was performed in a glove box under argon atmosphere. Next, the resultant was put at a temperature raised to 750° C. for three hours in a box furnace and kept for 40 hours. Thereafter, for recrystallization and crystal growth, the resultant was slowly cooled to room temperature for 200 hours to obtain a sample of $Na_2Al_2Sb_3$.

2) Removal of Na $AlCl_3$ was dissolved in acetonitrile to a concentration of 0.05 M and 2 ml of ethanol-based HCl was added thereto to prepare a solution, and then the solution was subjected to reaction over time to remove Na from the layered $Na_2Al_2Sb_3$. The results are shown in the table below. In Table 1, the residual Na represents the results obtained through energy dispersive X-ray spectroscopy (EDS) analysis.

TABLE 1

| Name of sample | Reaction time | Residual Na (at %) |
|---|---|---|
| Sample A | — | 28.5 |
| Sample B | 0.5 hours | 13.9 |
| Sample C | 2 hours | 8.8 |
| Sample D | 4 hours | 4.1 |
| Sample E | 12 hours | 0.25 |

3) Process of Preparing Nanosheets

The samples prepared as in Table 1 above were irradiated with ultrasonic waves in ethanol to prepare nanosheets peeled off therefrom using a tape.

Example 2

1) Synthesis of $KGaSb_2$ having a layered structure

Metal pieces of K, Ga, and Sb were weighed according to the molar ratio, mixed, and then put into an alumina crucible. Next, the mixture was placed in a quartz tube which was then double-sealed to block outside air. The process was performed in a glove box under argon atmosphere. Next, the resultant was put at a temperature raised to 750° C. for three hours in a box furnace and kept for 15 hours. Thereafter, for recrystallization and crystal growth, the resultant was slowly cooled at 500° C. for 100 hours, kept for 100 hours, and cooled to room temperature to obtain a final sample of $KGaSb_2$.

2) Removal of K $GaCl_3$ was dissolved in acetonitrile and 2 ml of ethanol-based HCl was added thereto to prepare a solution, and then the solution was subjected to reaction over time to remove K from the layered $KGaSb_2$. The results are shown in the table below. Residual K in Table 2 shows the results obtained through EDS analysis.

TABLE 2

| Name of sample | Reaction time | Residual K (at %) |
| --- | --- | --- |
| Sample A | — | 29.9 |
| Sample B | 0.5 hours | 17.5 |
| Sample C | 2 hours | 15 |
| Sample D | 4 hours | 6.6 |
| Sample E | 8 hours | 4.9 |
| Sample F | 12 hours | 0.29 |

3) Process of Preparing Nanosheets

The samples prepared as in Table 2 above were irradiated with ultrasonic waves in ethanol to prepare peeled nanosheets using a tape.

Example 3

1) Synthesis of $K_2In_2Sb_3$ having a layered structure

Metal pieces of K, In, and Sb were weighed according to the molar ratio, mixed, and then put into an alumina crucible. Next, the mixture was placed in a quartz tube which was then double-sealed to block outside air. The process was performed in a glove box under argon atmosphere. Next, the resultant was put at a temperature raised to 750° C. for three hours in a box furnace and kept for 15 hours. Thereafter, for recrystallization and crystal growth, the resultant was cooled to 500° C. at a temperature reduction rate of 5° C./h, and then kept for 100 hours at 500° C. and cooled to room temperature to obtain a sample of $K_2In_2Sb_3$ having a monoclinic crystal structure of a space group of $P2_1/c$.

2) Removal of K $InCl_3$ was dissolved in excess to prepare a 33% HCl solvent, and then the solvent was subjected to reaction over time to remove K from the layered $K_2In_2Sb_3$. The results are shown in the table below. Residual K in Table 3 shows the results obtained through EDS analysis.

TABLE 3

| Name of sample | Removal of additive elements | Reaction time | Residual K (at %) |
| --- | --- | --- | --- |
| Sample A | — | — | 25.0 |
| Sample B | Hydrochloric acid | 0.5 hours | 21.0 |
| Sample C | Hydrochloric acid | 2 hours | 10.1 |
| Sample D | Hydrochloric acid | 12 hours | 0.19 |

3) Process of Preparing Nanosheets

The samples prepared as in Table 3 above were irradiated with ultrasonic waves in ethanol to prepare nanosheets peeled off therefrom using a tape.

FIGS. 2A to 3B show results of analyzing the samples prepared according to Example 1.

Figure 2A:
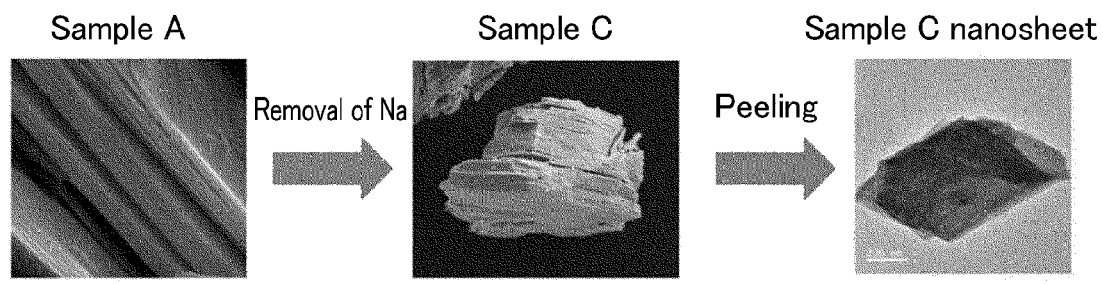
FIG. 2A to 2C are results of analyzing samples according to Example 1 of the invention.

FIG. 2A shows a nanosheet prepared by removing Na from Sample A of Example 1 to become Sample C, and being peeled off from Sample C using a tape. In Sample A, a cleavage plane between the layers was observed, but in Sample C, with the removal of Na, the interlayer distance increased, thereby forming cracks.

Figure 2B:
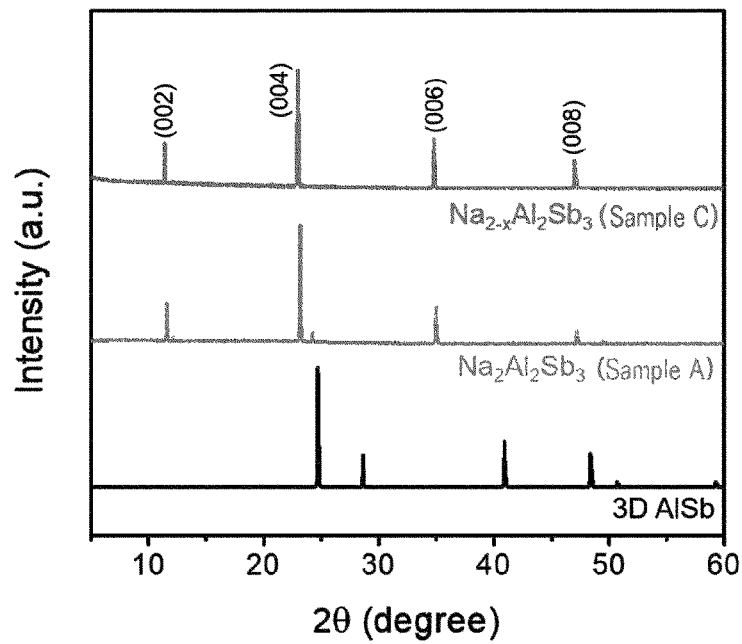

FIG. 2B shows diffraction peaks (3D AlSb) of a non-layered AlSb having a general zinc blende structure, diffraction peaks of Sample A of Example 1 (Sample A), and diffraction peaks of Sample C from which Na was partially removed (Sample C). The XRD diffraction pattern of Sample C showed main peaks in the same angular range according to the removal of Na when compared to Sample A, indicating that the monoclinic crystal structure of Sample A, which is $P2_1/c$, was still kept.

Figure 2C:
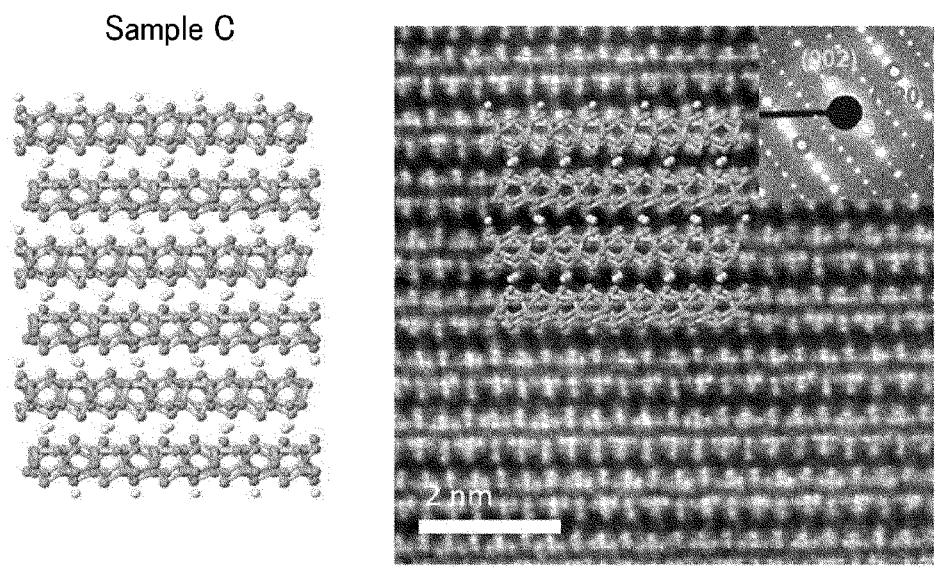

FIG. 2C is a schematic view of a layered $Na_2Al_2Sb_3$ atomic structure after selectively removing Na, and a STEM image in a [010] direction for Sample B, and a SAED pattern image. Results of SAED analysis showed that the interplanar distance of a (002) diffraction pattern was 7.79 Å, and the interplanar distance of a (020) diffraction pattern was 3.63 Å. Compared to the interplanar distance between theoretical (002) and (020) planes of 7.776 Å and 3.61 Å, respectively, the measured values were considered to be consistent with the theoretical values. These measurement values are not expected to be found in the non-layered AlSb having a zinc blende structure. In addition, given that the Na ratio of the parent structure $Na_2Al_2Sb_3$ is 28.5% but the Na ratio of the measured $Na_{2-x}Al_2Sb$ is 13.9%, it was confirmed that Na was partially removed. Further, the measured pattern is a pattern that only appears in the $P2_1/c$ space group. In the SAED pattern, a zone-axis may be obtained through an outer product from a plane measured by patterns, and a vector obtained through an outer product of the (002) and (020) plane is [100]. Therefore, it was confirmed that the zone-axis was found to be [100], and the lattice structure in the actually measured STEM image observed from the [100] zone and the shape of the theoretically obtained atomic structure model were exactly identical. From the results, it was confirmed that the material from which Na was removed also kept the $P2_1/c$ space group of the parent material $Na_2Al_2Sb_3$.

Figure 3A:
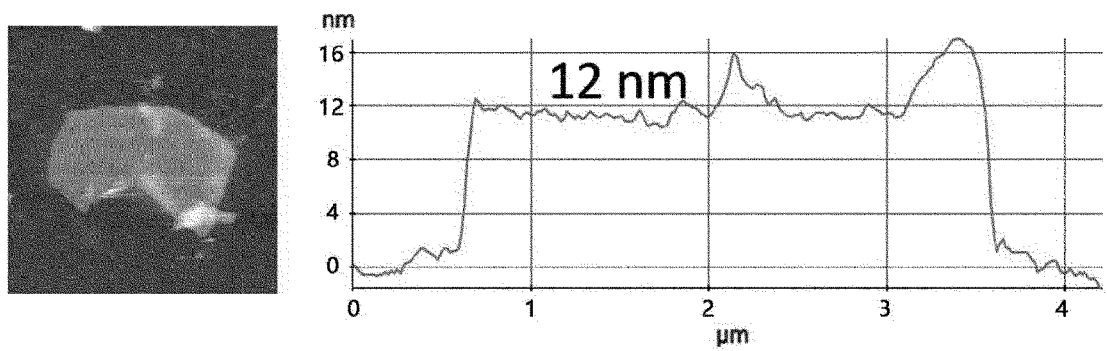
FIG. 3A to 3B are results of analyzing electrical properties of samples according to Example 1 of the invention.

FIG. 3A shows an AFM image of a nanosheet prepared by being peeled off from Sample C in Example 1 and a line profile therefrom. It was confirmed that a nanosheet was peeled off to have a thickness of 20 nm or less.

Figure 3B:
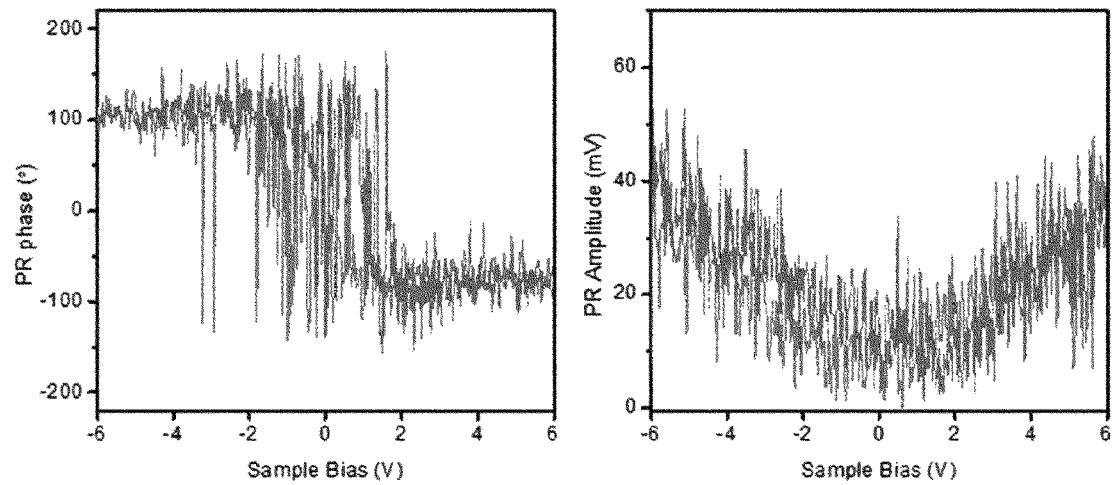

In addition, after preparing a nanosheet for Sample C from which Na was removed, ferroelectric-like properties were measured through PFM, and results are shown in FIG. 3B. From the results, it was observed that the ferroelectric-like properties were present.

FIGS. 4A to 5B show results of analyzing samples prepared according to Example 2.

Figure 4A:
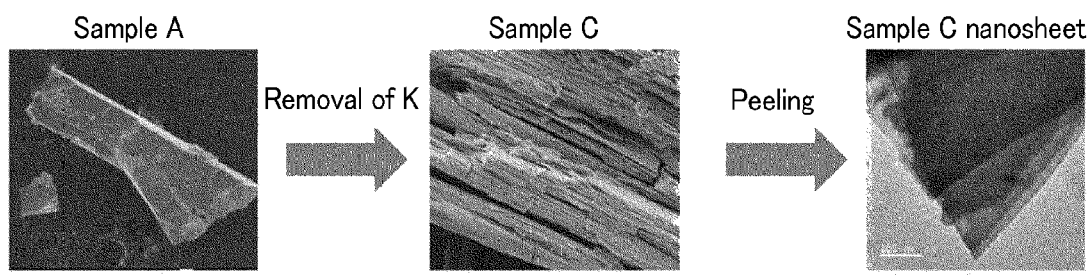
FIG. 4A to 4C are results of analyzing samples according to Example 2 of the invention.

FIG. 4A shows a nanosheet prepared by removing K from Sample A of Example 2 to become Sample C, and being peeled off from Sample C using a tape. In Sample A, a cleavage plane between the layers was observed, but in Sample C, with the removal of K, the interlayer distance increased, thereby forming cracks.

Figure 4B:
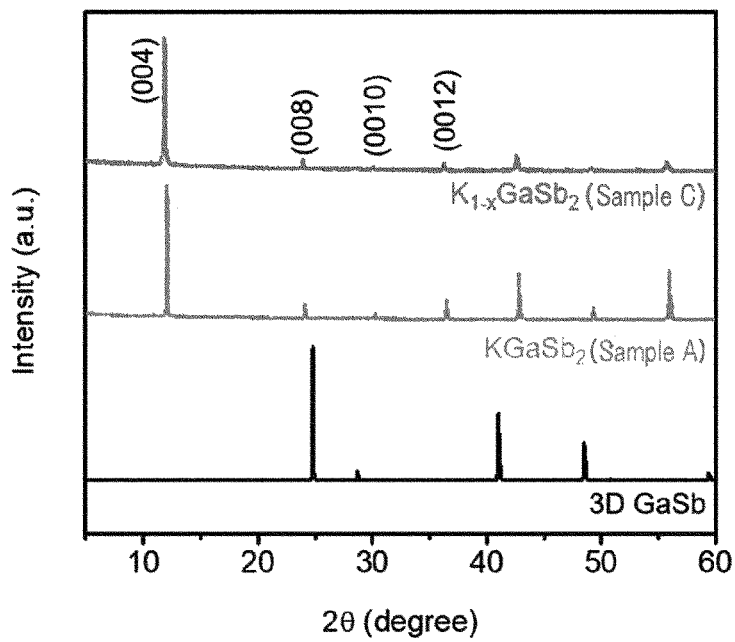

FIG. 4B shows diffraction peaks (3D GaSb) of a non-layered GaSb having a general zinc blende structure, diffraction peaks of Sample A, and diffraction peaks of Sample C from which K was partially removed. The XRD diffraction pattern of Sample C showed main peaks in the same angular range according to the removal of K when compared to Sample A, indicating that Cmca of Sample A, an orthorhombic crystal structure, was still kept.

Figure 4C:
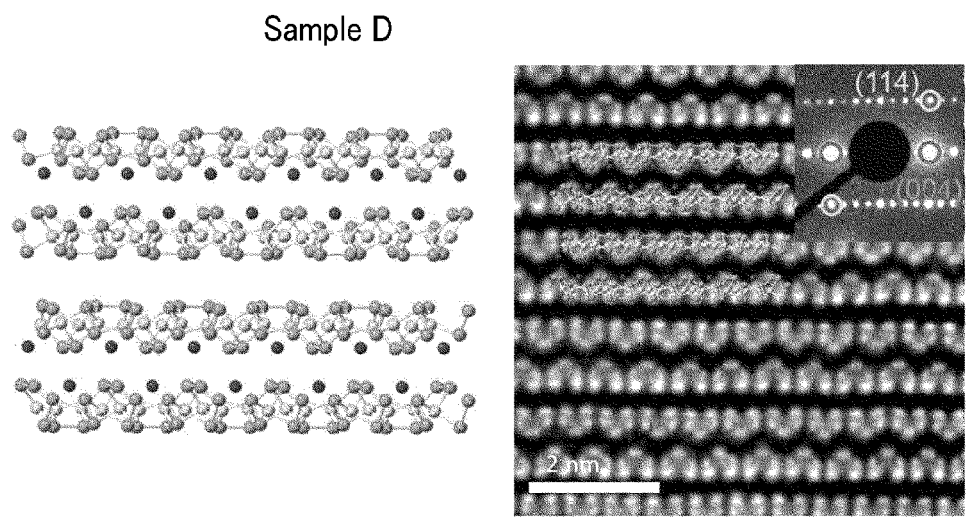

FIG. 4C is a schematic view of a layered $K_{1-x}GaSb_2$ atomic structure after selectively removing K, and a STEM image in a [010] direction for Sample D, and a SAED pattern image. The atomic ratio of residual K ions was 6.59 at %. Results of SAED analysis showed that the interplanar distance of a (004) diffraction pattern was 7.465 Å, and the interplanar distance of a (114) diffraction pattern was 5.07 Å. Compared to the interplanar distance between theoretical (004) and (114) planes of 7.408 Å and 5.10 Å, respectively, the measured values were considered to be consistent with the theoretical values. These measurement values are not expected to be found in the non-layered GaSb having a zinc blende structure. In addition, given that the K ratio of the parent structure KGaSb$_2$ is 25 at % but the Na ratio of the measured K$_{1-x}$GaSb$_2$ is 6.59 at %, it was confirmed that K was partially removed, and the measured pattern was a pattern that is only found in the Cmca space group. In the SAED pattern, a zone-axis may be obtained through an outer product from a plane measured by patterns, and a vector obtained through an outer product of the (004) and (114) plane is [1-10]. Therefore, it was confirmed that the zone-axis was found to be [1-10], and the lattice structure in the actually measured STEM image observed from the [1-10] zone and the shape of the theoretically obtained atomic structure model were exactly identical. Accordingly, it was confirmed that the material from which K was removed as well still kept the Cmca space group of the parent material KGaSb$_2$.

Figure 5A:
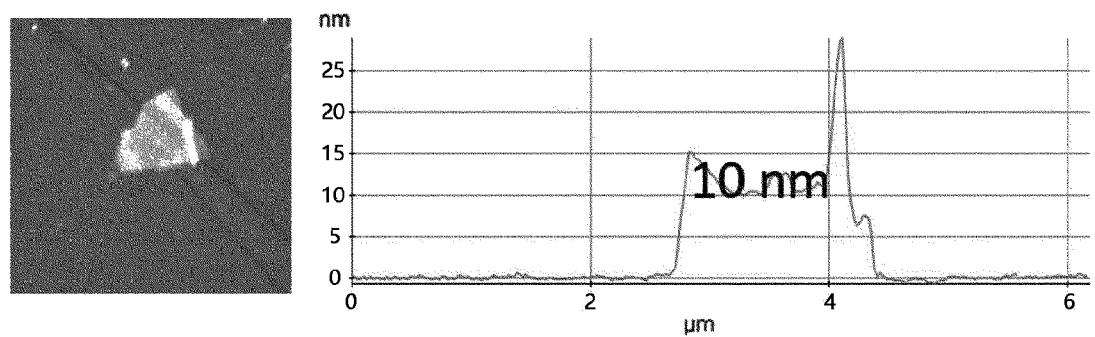
FIG. 5A to 5B are results of analyzing electrical properties of samples according to Example 2 of the invention.

FIG. 5A shows an AFM image of a nanosheet prepared by being peeled off from Sample C in Example 2 and a line profile therefrom. It was confirmed that a nanosheet was peeled off to have a thickness of 10 nm.

Figure 5B:
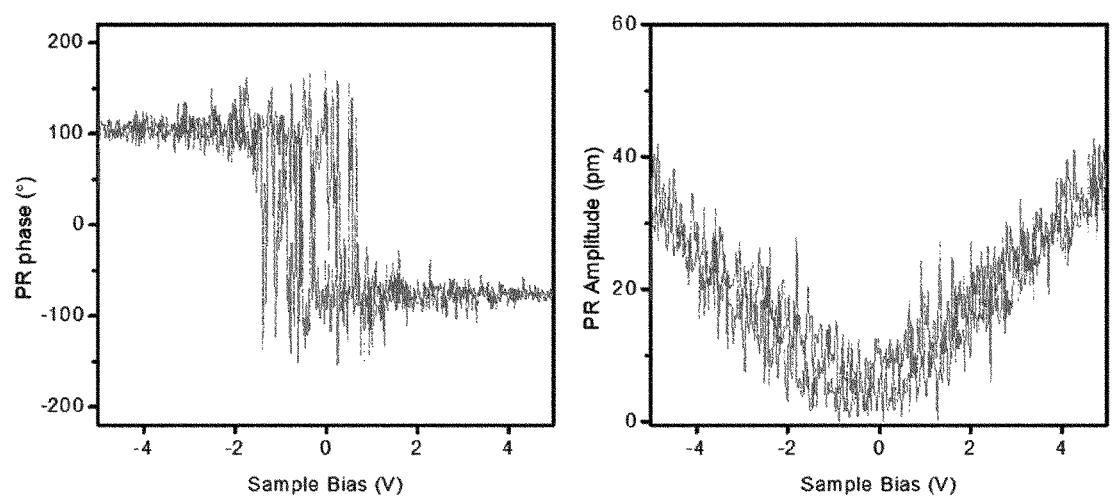

In addition, in FIG. 5B, after preparing a nanosheet for Sample C from which K was removed, ferroelectric-like properties were measured through PFM, and results are shown. Accordingly, it was observed that the ferroelectric-like properties were present. It was found that using the ferroelectric-like properties, it may be possible to apply to various electrical devices, and to a memristor device, which has been actively developed as a neuromorphic memory device in recent years.

FIGS. 6A to 7B show results of analyzing samples prepared according to Example 3.

Figure 6A:
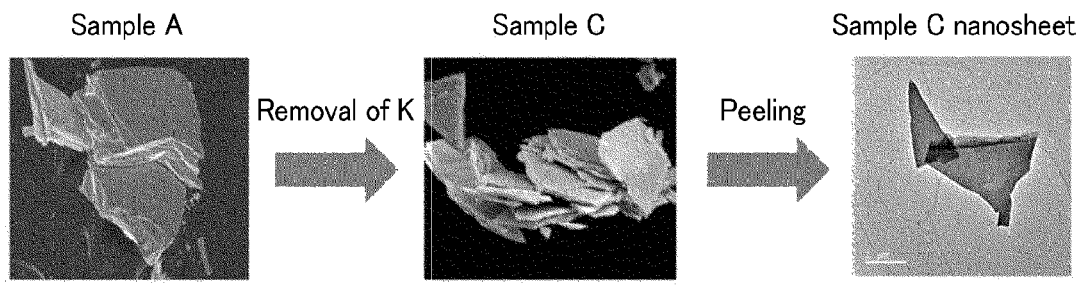
FIG. 6A to 6C are results of analyzing samples according to Example 3 of the invention.

FIG. 6A shows a nanosheet prepared by removing K from Sample A of Example 3 to become Sample C, and being peeled off from Sample C using a tape. In Sample A, a cleavage plane between the layers was observed, but in Sample C, with the removal of Na, the interlayer distance increased, thereby forming cracks.

Figure 6B:
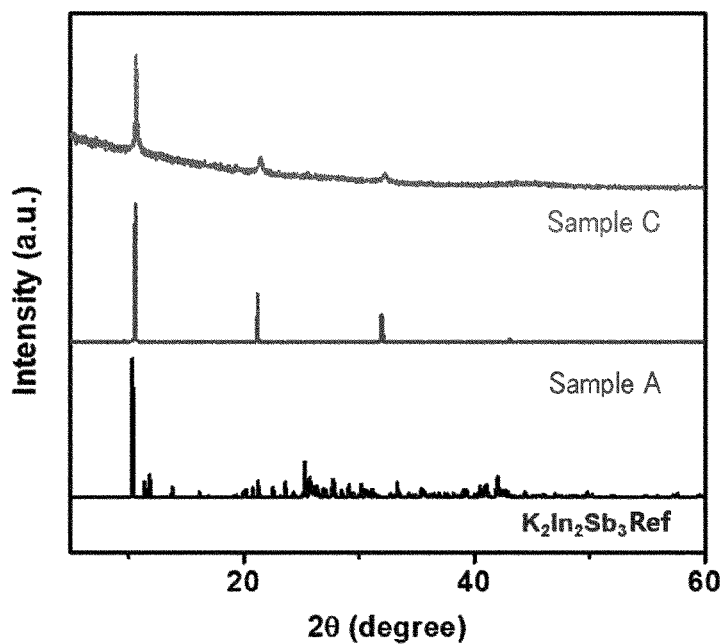

FIG. 6B shows a reference data graph (K$_2$In$_2$Sb$_3$ Ref) of a K$_2$In$_2$Sb$_3$ single crystal, and a graph showing XRD results of Sample A of Example 3 and Sample C in which K was partially removed from Sample A. The XRD diffraction pattern of Sample C, though slightly lower in crystallinity, showed main peaks in the same angular range according to the removal of K when compared to Sample A, indicating that the monoclinic crystal structure, which is P2$_1$/c of Sample A, was still kept.

Figure 6C:
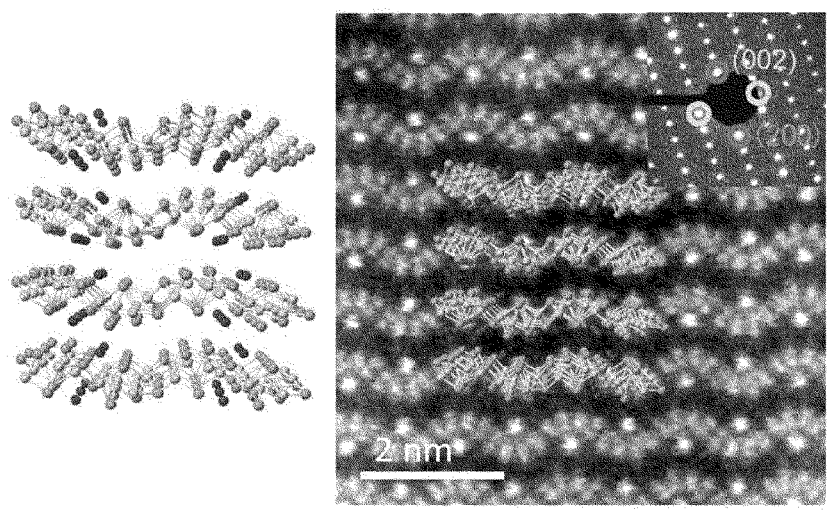

FIG. 6C is a schematic view of a layered K$_{2-x}$In$_2$Sb$_3$ atomic structure after selectively removing K in Example 3, and a STEM image in a [010] direction for Sample C, and a SAED pattern image. Results of SAED analysis showed that the interplanar distance of a (002) diffraction pattern was 8.3 Å, and the interplanar distance of a (200) diffraction pattern was 7.64 Å. Compared to the interplanar distance between theoretical (200) and (002) planes of 7.6437 Å and 8.3946 Å, respectively, the measured values were considered to be consistent with the theoretical values. These measurement values are not expected to be found in the non-layered InSb having a zinc blende structure. In addition, given that the K ratio of the parent structure K$_2$In$_2$Sb$_3$ is 28.5 at % but the K ratio of the measured Na$_{2-x}$Al$_2$Sb is 10.1 at %, it was confirmed that K was partially removed. Further, the measured pattern is a pattern that only appears in the P2$_1$/c space group. In the SAED pattern, a zone-axis may be obtained through an outer product from a plane measured by patterns, and a vector obtained through an outer product of the (002) and (200) planes is [010]. Therefore, it was confirmed that the zone-axis was [010], and the lattice structure in the actually measured STEM image observed from the [010] zone and the shape of the theoretically obtained atomic structure model were exactly identical. Accordingly, it was confirmed that the material from which K was removed as well kept the P2$_1$/c space group of a parent material K$_2$In$_2$Sb$_3$.

Figure 7A:
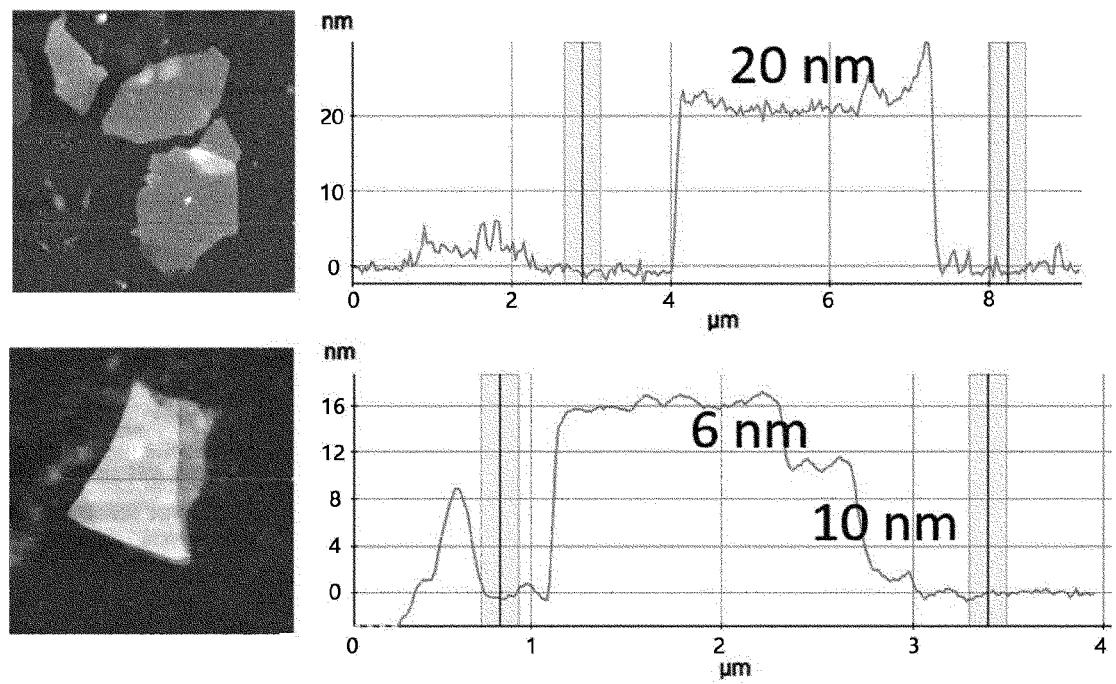
FIG. 7A to 7B are results of analyzing electrical properties of samples according to Example 3 of the invention.

FIG. 7A shows an AFM image of a nanosheet prepared by being peeled off from Sample C in Example 3 and a line profile therefrom. It was confirmed that a nanosheet was peeled off to have a thickness of 20 nm or less.

Figure 7B:
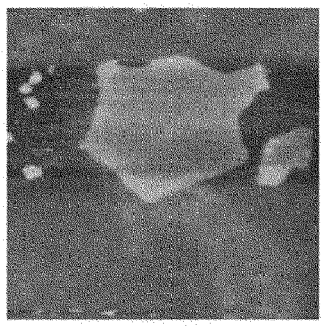
Figure 7B:
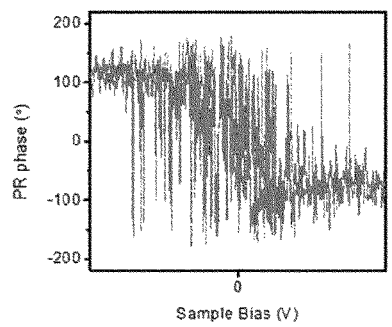
Figure 7B:
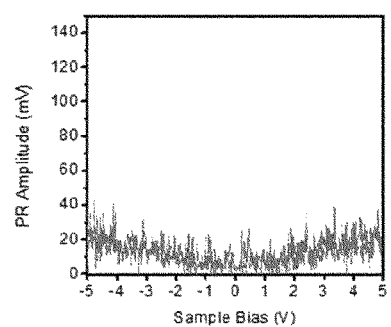
Figure 7B:
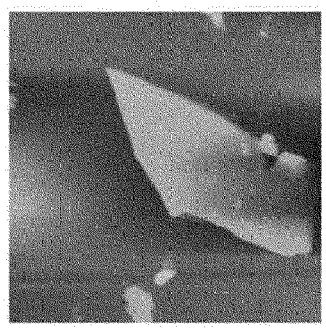
Figure 7B:
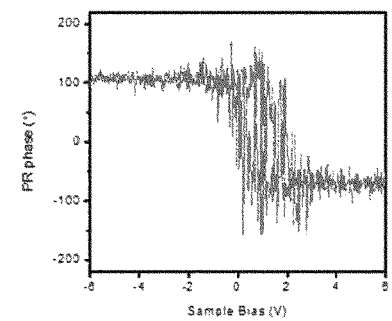
Figure 7B:
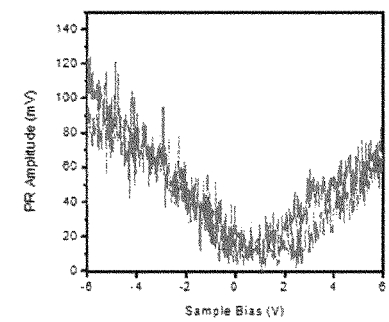

In addition, in FIG. 7B, the ferroelectric-like properties were measured through PFM after preparing a nanosheet for Sample A before the removal of K and Sample C after the removal of K in Example 3, and a hysteresis loop therefrom is shown. Before K was removed, ferroelectric properties were not observed, but in Sample C from which K was removed, ferroelectric properties were observed.

What is claimed is:

1. A layered compound having a composition represented by Formula 1 below:

$$M_{x-m}A_ySb_z \quad \text{[Formula 1]}$$

(where M is at least one of Group I elements, A is at least one of Group III elements, x, y, and z are positive numbers which are determined according to stoichiometric ratios to ensure charge balance when m is 0, and 0.1x≤m≤0.9x), wherein the layered compound exhibits ferroelectric-like properties.

2. The layered compound according to claim 1, wherein the m satisfies 0.25x ≤m≤0.75x.

3. The layered compound according to claim 1, wherein the M is Na, K or a combination thereof.

4. The layered compound according to claim 1, wherein the A is Al, Ga, In or a combination thereof.

5. The layered compound according to claim 1, wherein the layered compound further comprises H.

6. The layered compound according to claim 1, wherein a crystal structure of the layered compound exhibits a space group of P2$_1$/c or a space group of Cmca.

7. The layered compound according to claim 1, wherein the layered compound comprises an amorphous phase.

8. The layered compound according to claim 1, wherein the layered compound exhibits resistance switching properties.

9. A nanosheet comprising a composition represented by Formula 1 below, and prepared through a physical or chemical peeling method:

$$M_{x-m}A_ySb_z \quad \text{[Formula 1]}$$

(where M is at least one of Group I elements, A is at least one of Group III elements, x, y, and z are positive numbers which are determined according to stoichiometric ratios to ensure charge balance when m is 0, and 0.1x≤m≤0.9x)

wherein the nanosheet exhibits ferroelectric-like properties.

10. The nanosheet according to claim 9, wherein a crystal structure of the nanosheet exhibits a space group of P2$_1$/c or a space group of Cmca.

11. The nanosheet according to claim 9, wherein the nanosheet comprises an amorphous phase.

12. The nanosheet according to claim 9, wherein the nanosheet exhibits resistance switching properties.

13. An electrical device comprising the layered compound according to claim claim 1.

* * * * *